United States Patent [19]

Arney et al.

[11] 4,448,516

[45] May 15, 1984

[54] DEVELOPER ROLL

[75] Inventors: Jonathon S. Arney; Richard F. Wright, both of Chillicothe, Ohio

[73] Assignee: The Mead Corporation, Dayton, Ohio

[21] Appl. No.: 397,681

[22] Filed: Jul. 13, 1982

[51] Int. Cl.³ .................... G03B 27/32; G03B 27/52
[52] U.S. Cl. ..................................... 355/27; 355/100
[58] Field of Search ........................ 355/27, 28, 100

[56] References Cited

U.S. PATENT DOCUMENTS

| | | | |
|---|---|---|---|
| 3,684,372 | 8/1972 | Limberger | 355/27 X |
| 3,695,755 | 10/1972 | Egnaczak | 355/27 X |
| 4,183,751 | 1/1980 | Matsumoto et al. | 355/100 X |

*Primary Examiner*—Richard A. Wintercorn
*Attorney, Agent, or Firm*—Arnold, White & Durkee

[57] ABSTRACT

This invention relates to image developing apparatus and specifically a developer roll for use in combination with a color producing substrate. In accordance with this invention, a color is formed by the reaction of isolated chromogenic materials. A first chromogenic material is typically a color precusor of the electron donating type whereas the second chromogenic material is typically identified as a color developer and is generally of the electron accepting type. In this invention a developer roll bunishes the active coating on the color producing substrate to promote the reaction of the color forming ingredients. This developing action is accomplished without "rupturing pressure" or without the necessity for pressure rollers which define a pressure nip.

15 Claims, 9 Drawing Figures

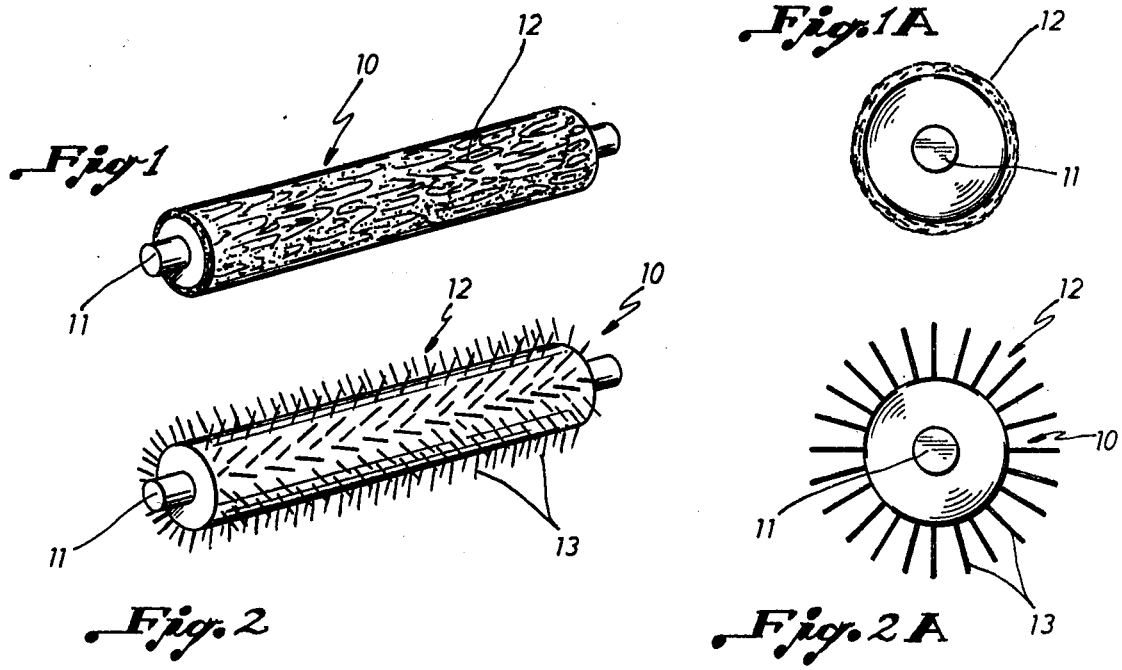
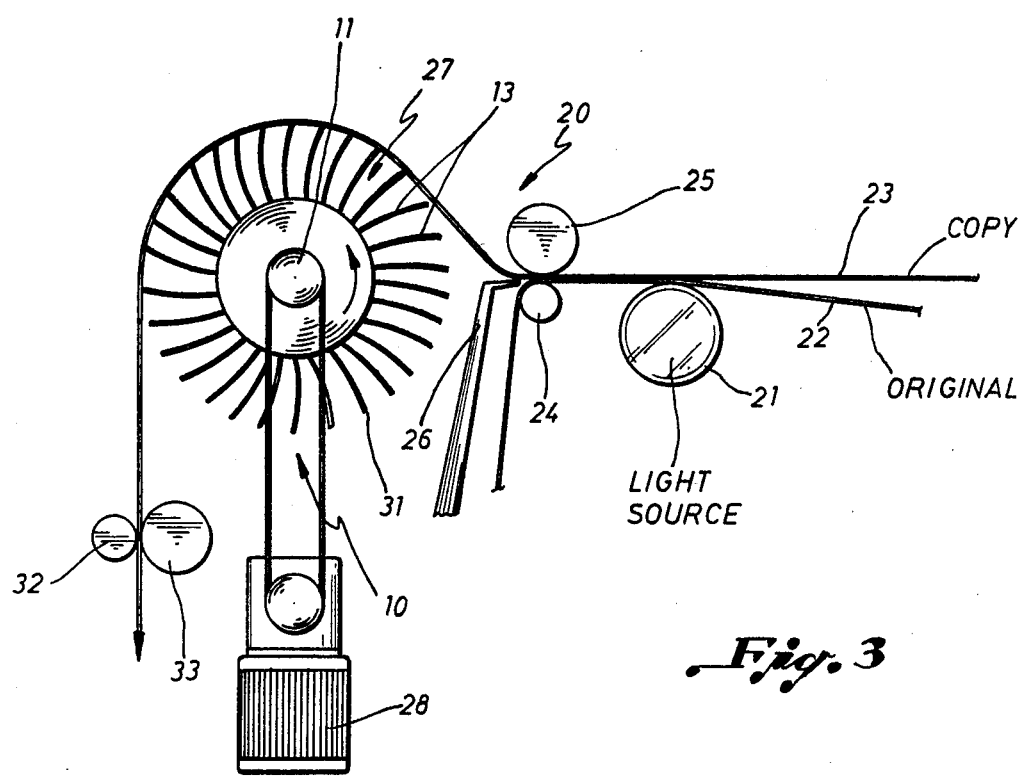

DEVELOPER ROLL

BACKGROUND OF THE INVENTION

The instant invention relates to image developing apparatus and specifically a developer roll for use in combination with a color producing substrate. In accordance with this invention, a color is formed by the reaction of isolated chromogenic materials. A first chromogenic material is typically a color precursor of the electron donating type whereas the second chromogenic material is typically identified as a color developer and is generally of the electron accepting type. In this invention a developer roll burnishes the active coating on the color producing substrate to promote the reaction of the color forming ingredients. This developing action is accomplished without "rupturing pressure" or without the necessity for pressure rollers which define a pressure nip.

One type of substrate for which image developing apparatus such as the developer roll of this invention is necessary is commonly referred to as carbonless paper. Carbonless paper is a common, commercially used type of pressure sensitve paper wherein during manufacture the backside of the paper substrate is coated with what is referred to as CB coating, the CB coating containing one or more color precursors generally in capsular form. At the same time the front side of the paper substrate is coated during manufacture with what is referred to as a CF coating, which contains one or more color developers. Both the color precursor and the color developer remain in the coating compositions on the respective back and front surfaces of the paper in colorless form.

This is true until the CB and CF coatings are brought into contiguous relationship and sufficient pressure, as by a typewriter or stylus, is applied to rupture the capsules in the CB coating to release the color precursor. At this time the color precursor contacts the CF coating and reacts with the color developer therein to form a color. Generally, this color is formed in a pattern of an image such as an alphanumeric character or the like. Thus the image from the top surface of the top sheet is transferred to the next sheet without the use of carbon paper.

A related product, and one for which the developer roll of this invention has special utility is referred to as self-contained paper. Very generally, self-contained paper refers to an image transfer system wherein only one side of the paper needs to be coated and the one coating contains both the color precursor, generally in encapsulated form, and the color developer. Thus, when pressure is applied, again as by a typewriter, stylus or other writing instruments, the color precursor capsule is ruptured and the internal phase reacts with the surrounding color developer to form an image. Both the carbonless paper system and the self-contained carbonless paper system have been the subject of a great deal of patent activity.

A second type of product which requires developer roll activity is described as self-developing film for use with fully automatic photographic cameras. Typical of these cameras and the film which is used in them is Polaroid Corporation's SX-70 and Pronto and Eastman Kodak Company's EK-6 and EK-8 cameras. These cameras and the film used therein are designed to automatically produce finished, waste free color prints with virtually no operator involved other than to compose the picture, focus and then actuate the camera by depressing its cycle start button.

Once actuated, the order of camera operations begins with exposure of a film unit. Afterwards, the exposed film unit is advanced from its exposure location into engagement with a film processing subsystem or apparatus which initiates a diffusion transfer process in the film unit while transporting it to the exterior of the camera where it becomes accessible to the photographer. After the diffusion transfer process is initiated, it develops and forms a visible image in the film unit in a well-known manner.

Typically necessary in systems such as this are pressure rollers to diffuse the active ingredients. See for example, U.S. Pat. No. 2,435,717 (1948) to Land; U.S. Pat. No. 2,495,113 (1950) to Gannon. Also described in the prior art are pressure ebbs for "film pods", see for example, U.S. Pat. No. 2,659,825 (1953) to Land or along the same lines squeezing rollers such as demonstrated by U.S. Pat. No. 2,751,814 (1956) to Limberger. Other patents generally known to be pertinent to this concept are U.S. Pat. No. 2,971,445 (1961) to Orlando; U.S. Pat. No. 3,134,313 (1964) to Gold et al.; U.S. Pat. No. 3,249,434 (1966) to Land et al.; U.S. Pat. No. 3,615,132 (1971) to Turner; U.S. Pat. No. 4,017,879 (1977) to Lermann et al.; U.S. Pat. No. 4,200,382 (1980) to Friedman; and U.S. Pat. No. 4,256,392 (1981) to Stemme et al.

Another line of products which typically require developer rolls or the like are described in previously mentioned U.S. Pat. No. 3,615,132 to Turner and assigned to the Xerox Corporation. These patents describe what is referred to as the process of xerography, which is also disclosed for example in Carlson Pat. No. 2,297,691. In this process a xerographic plate comprising a layer of photoconductive insulating material on a conductive backing is given a uniform electric charge over its surface and then exposed to the subject matter to be reproduced usually by conventional projection techniques. This exposure discharges the plate areas in accordance with the light intensity that reaches them, and thereby creates an electrostatic latent image on or in the photoconductive layer. Development of the latent image is effected with an electrostatically charged, finely divided material, such as an electroscopic powder, which is brought into surface contact with the photoconductive layer and is held thereon electrostatically in a xerographic powder image pattern corresponding to the electrostatic latent image. Thereafter, the developed xerographic powder image is usually transferred to a support surface, such as, a sheet of copy paper to which it may be fixed by any suitable means.

Since the disclosure in Carlson, many improvements have been in xerographic devices and techniques and, as a result, both manual and automatic machines for carrying out xerographic reproduction processes are in wide commercial use.

While a variety of commercial processes involving a color development or color transfer system have been described above, they all suffer from a common deficiency. In any of the systems wherein color development takes place between co-reactive materials, it is common to use pressure rollers for purposes of developing the color. This is done when the co-reactant materials are maintained in isolation from one another. By use of the apparatus and method of this invention pressure rollers are no longer necessary for the development of colors between co-reacted materials. Rather than use a pressure nip to crush, squeeze, diffuse or otherwise physically distort coatings or substrates a more subtle force is applied by means of the developer roll of this invention. The developer roll of this invention relies on a burnishing effect on the active surface of the reactive coating and the optional application of heat to develop, enhance and project developed colors. Common disadvantages of the high pressure rollers common to the prior art systems are that they require not only high pressure, but also precision alignment in order to develop color without crimping or creasing the sheet.

Several terms need to be defined for purposes of this application. The term "rupturing pressure" should be understood to mean the pressure necessary to crush microcapsules coated onto a paper substrate. In typical carbonles paper embodiments wherein rupturing pressure is applied by means of a typewriter or stytus-like instrument, in order to assure uniform capsule rupture a rupturing pressure of greater than 100 kg/cm$^2$ is required.

The "force" necessary to release the internal phase of capsules shall be understood to mean the burnishing force, heat force or frictional force developed by use of the apparatus of this invention to rupture or release the contents of the microcapsules which have been coated onto the substrate.

The term "image-wise exposing" shall be understood to mean that the reaction between the chromogenic material and the developer occur according to the exposure such that a positive or negative image is obtained. The image may be formed by a change in color or a difference in contrast.

SUMMARY OF THE INVENTION

Thus, a principle object of the present invention is to provide a developer roll which does not rely on pressure for the development of color between co-reactive components.

Another object of the present invention is to provide an inexpensive and lightweight development system which is adaptable to use in small photocopiers; cameras, and other apparatus wherein convenience, size and weight are of paramount importance.

Still another object of the instant invention is a safe development apparatus which does not require pressure nips such as in the prior art which are known to be unsafe if not used properly.

A more specific object of the present invention is to provide a developer apparatus for use with self-contained photosensitive papers which does not rely on crushing or squeezing pressures as are typical of prior art systems.

These and other objects of this invention are attained in the present invention in which its preferred embodiment relates to the use of a photosensitive substrate which includes: a substrate, a chromogenic material, a photosensitive composition, a coating containing a chromogenic material and a photosensitive composition on one surface of the substrate, and a developer material which is capable of reacting with the chromogenic material to form a visible image, wherein said photosensitive composition is encapsulated in a pressure rupturable capsule as an internal phase. For more information concerning this general concept and specifics as to this imaging system reference is made to commonly assigned copending patent applications Ser. Nos. 320,643 and 302,356 both filed on Nov. 12, 1981, which disclosure is specifically incorporated herein by reference.

Herein, the term "encapsulated" refers to both so-called dispersion or open phase systems in which the internal phase containing the photosensitive composition and optionally the chromogenic material are dispersed as droplets throughout a dispersing medium and also to systems in which the capsule is formed with a discrete capsule or wall, the later encapsulation typically being in the form of microcapsules.

"Pressure rupturable capsules" are, accordingly, considered to exist in either of these "encapsulated" systems. When generically referring to these materials the phrase "isolated" will sometimes be used. This term should be understood to mean that one or the other of the co-reactive materials must be isolated from the other in order to prevent premature color development.

BRIEF DESCRIPTION OF THE DRAWINGS

FIG. 1 is a developer roll showing one embodiment of this invention;

FIG. 1A is a cross-sectional view of the developer roll of FIG. 1.

FIG. 2 is a developer roll showing a second embodiment of this invention with flexible bristles;

FIG. 2A is a cross-sectional view taken along the line 2A—2A in FIG. 2 and showing the flexible bristle embodiment of the developer roll of this invention;

FIG. 3 is a schematic of a positive working diazo process utilizing the developer roll of this invention;

DETAILED DESCRIPTION OF THE INVENTION

Figure 4:
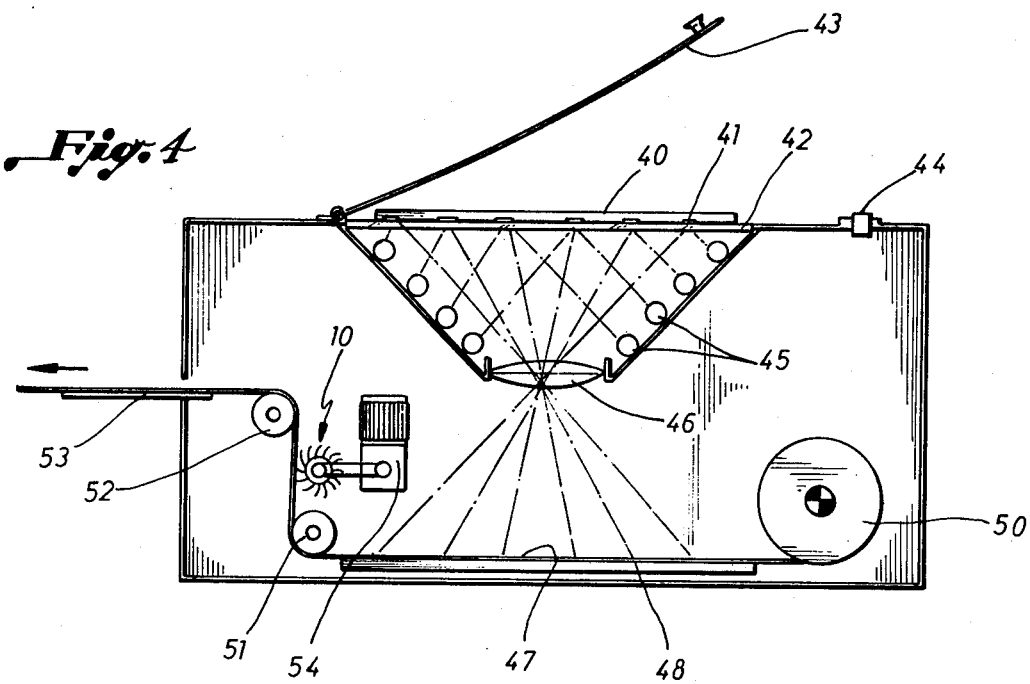
FIG. 4 is a schematic of a positive working photocopying apparatus using the developer roll of this invention.

For the purposes of promoting and understanding of the principles of this invention, reference will now be made to the embodiments illustrated in the drawings and specific claims will be used to described the same. It will nevertheless be understood that no limitation of the scope of the invention is thereby intended, such alterations and further modifications in the illustrated device, and such further application of the principles of the invention as illustrated therein contemplated as would normally occur to one skilled in the art to which the invention relates.

FIG. 1 illustrates one embodiment of the developer roll of this invention. In FIG. 1 the developer roll 10 is shown as comprising a mandrel 11 and an outer fibrous surface 12. Outer fibrous surface 12 is composed of interwoven fibers of natural or synthetic material. A common example of a developer roll such as this is the commonly available replaceable roll used for purposes of painting. These rollers as well as the rollers which are useful in the developer roll invention of this application typically consist of matted fibers or other flexible material. This description of the "outer fibrous surface" is not intended to be limiting but rather as merely illustrative of the various embodiments contemplated. The variety of paper and chemicals to be developed may well dictate the specific outer fibrous surfaces to be used. A felt outer surface is also considered a preferred embodiment together with the flexible bristles and paint roller surface as already described.

FIG. 1A shows a cross-sectional area of developer roll 10 of FIG. 1, but shows in more detail fibrous outer surface 12. Mandrel 11 is intended to provide the rotational basis for the developer roll 10. Mandrel 11 may consist of one or more parts which may be variously sized depending upon speeds and equipment which are used in the developing process.

A second embodiment of the developer roll of this invention is illustrated by FIGS. 2 and 2A. In FIG. 2 the developer roll 10 includes a mandrel 11 as well as a fibrous outer surface 12. However, in FIG. 2 the fibrous outer surface 12 consists of a plurality of flexible bristles 13.

FIG. 2A shows in cross-section the embodiment of FIG. 2. Illustrated more clearly are the mandrel 11, fibrous outer surface 12 and flexible bristles 13. It should be understood that the embodiments illustrated by FIGS. 1 and 2 are meant to be merely exemplary of a large variety of surface materials which can be used in the developmental process of this invention.

Although the developer roll 10 of this invention is intended for use with a variety of reactive substrates and in combination with a variety of imaging apparatuses, two examples are provided for purposes of illustration. These examples are provided in FIGS. 3 and 4 and relate generally to a positive working diazo system and a positive working photocopying system, respectively. These examples are provided for purposes of illustration only and are not meant to be limiting in any fashion on the scope or application of the developer roll of this invention.

Referring now to FIG. 3 a diazo apparatus 20 is illustrated. The diazo apparatus 20 includes a light source 21 which is positioned to emit light through an original 22 onto a reactive copy sheet 23. The original 22 and reactive copy sheet 23 are then conveyed in abutting relationship through driven roller 24 and guide roller 25. A separating apparatus 26 then separates original 22 from copy 23.

The copy substrate 23 and more particularly the coated surface of substrate 23 is then conveyed around developer or burnishing roller 27. Roller 27 consists of a driven mandrel 11 which is driven by motor 28. Burnishing roller 27 also includes flexible bristles 13. The surface 31 of roller 27 is operated at a speed substantially faster than the speed of the copy paper 23. This provides the burnishing and developing effect which is desired to formulate the color between the co-reacted materials on the reactive surface of copy sheet 23. Copy sheet 23 is then advanced through driven roller 32 and guide roller 33. It should be noted that rollers 25 and 33 do not exert rupturing pressure on the copy sheet. After exiting from rollers 32 and 33, the color and/or image will have been developed or will be in the process of developing. At this point in time, if a continuous roll is being used appropriate cutting or sectioning apparatus can be used to section the roll into sheets. Or, on the other hand, if sheets of the particular substrate are being fed through the apparatus then the sheets can be ejected into appropriate catching apparatus.

Although it has been shown to be essential that the surface speed of the roller be greater than the speed of the paper web or substrate the precise ratio of roller speed to copy paper speed is not critical so long as the desired burnishing effect is achieved. In general, it is felt that a ratio of roller speed to substrate speed of from about 10:1 to about 500:1 is an effective range although a more preferred range would be 10:1 to 100:1 and a most preferred range would be 10:1 to 25:1. It is necessary to achieve a proper balance between speed of the roller to produce the desired reaction and at the same time not cause damage to the substrate.

The variety of combinations of imaging apparatus, light sources, roller drive mechanisms, motors to drive the developer roll, catchers or other finishing apparatus are infinite. The essential portion of this invention is the use of a developer roll such as has been described to develop co-reactive materials without the necessity for the standard pressure rolls, pressure nips and the pertinent problems associated therewith.

Turning now to FIG. 4 a different piece of apparatus is shown for imaging and developing reactive copy sheets. In FIG. 4 what is referred to as a desk top copier is shown. In this embodiment, an original 40 is placed with the written side 41 adjacent a glass or plastic, transparent, plate 42. A cover 43 is then lowered on top of the original 40.

The copying process is initiated by actuation of switch 44 which activates light sources 45. Light sources 45 emit an appropriate light, such as ultraviolet, which is either selectively absorbed or reflected off of printed surface 41. The reflected light is then passed through an appropriately dimensioned lens 46 and then refocused on active surface 47 of copy sheet 48. Copy sheet 48 can be either in sheet form or in roll form. The roll form is illustrated by number 50 in FIG. 4.

After a predetermined exposure time of active surface 47, the light emitting sources 45 are turned off and the paper is advanced via rollers 51 and 52, either or both of which may be driven, to a catching station 53. Between rollers 51 and 52 is located developer or burnishing roller 10 which is driven by drive motor or actuating means 54. Drive motor 54 can be any of a variety of well-known electrical or mechanical motors.

Burnishing roller 10 is shown in its preferred embodiment which includes a mandrel 11 and a plurality of flexible bristles 13. In this fashion the coating 47 is selectively exposed to actinic radiation emitted from light sources 45. In the preferred embodiment the microcapsules are then selectively activated or deactivated whereupon burnishing by developer roller 10 a color is developed.

Figure 5:
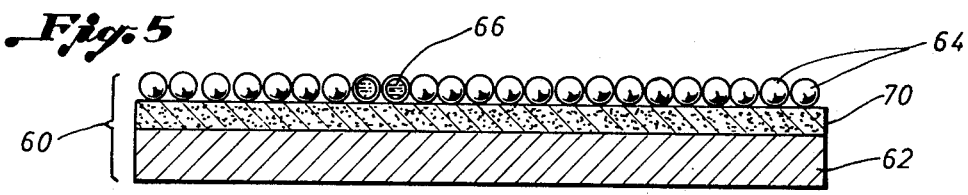
FIG. 5, is a schematic illustration in cross-sectional of a self-contained imaging sheet having use in combination with the developer roll of this invention.

FIG. 5 illustrates one embodiment of the imaging system/copy paper which is useful in combination with the developer roll of the present invention. In this copy paper a self-contained imaging sheet 60 is shown. The imaging sheet 60 is constituted by a substrate 62 coated with a layer of microcapsules 64. The microcapsules are filled with an internal phase 66 containing a chromogenic material and a photosensitive system. Interposed between a layer of microcapsules 64 and the substrate 62 is a layer of a developer material 70. In actuality, the microcapsules 64 are not visible to the unaided eye.

Figure 6:
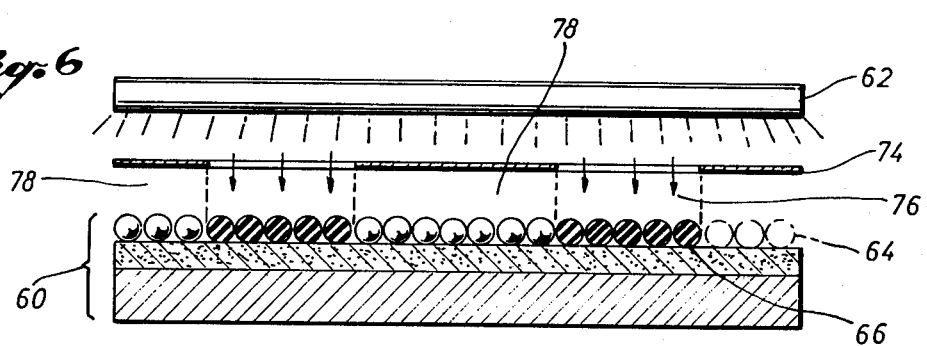
FIG. 6 is a schematic illustration of exposure and development of the imaging sheet of FIG. 5.

Exposure of the imaging sheet 60 by transmission imaging is shown in FIG. 6 wherein a source of radiant energy 62 is positioned above the surface of the imaging sheet 60 with a mask 74 therebetween. In this illustration the photosensitive material is designated a resin curable material and, hence, the imaging sheet is positive working. Exposure is shown as solidifying the internal phase 66 in the exposed area 76 whereas the internal phase 66 remains liquid in the unexposed areas 78.

Transmission imaging has been selected to illustrate the invention systems operation for the ease with which it can be illustrated. An equally common exposure means is reflection imaging which is used in copying printed documents.

Figure 7:
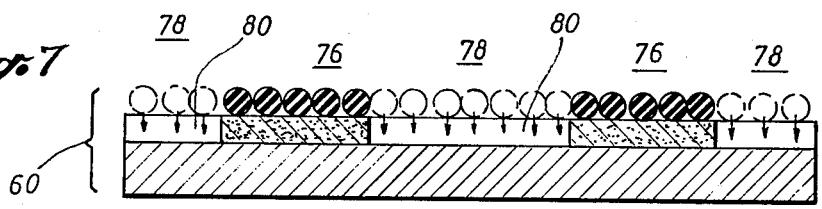
FIG. 7 is a schematic illustration of the developed sheet of FIG. 6.

FIG. 7 illustrates the imaging sheet 60 after the microcapsules have been ruptured. For simplification, the microcapsules are shown as being ruptured in the unexposed area 78 and unruptured in the exposed area 76. In actuality all or a portion of the capsules may also be ruptured in area 76. In unexposed area 78 the chromogenic material and the developer react to form a visible image 80. FIGS. 5, 6 and 7 represent but one embodiment of the color producing substrate which is useful in combination with the developer roll of this invention.

Although several embodiments have been illustrated it should be understood that on many other commercially useful embodiments are contemplated as coming within the scope of this invention. In one such embodiment a plurality of developer rollers would be used instead of the single roller illustrated by the drawing. In another embodiment heat means would be supplied to act in combination with the developer roll. The heat supplied by this separate heat means would be in addition to the heat which is typically produced as a by-product of the friction between the developer roller and the reactive substrate.

While the invention has been illustrated and described in detail in the drawings in the foregoing description, the same is to be considered as illustrative and not restrictive in character, it being understood that only the preferred embodiment has been shown and described and that all changes and modifications that come within the spirit of the invention are desired to be protected.

What is claimed is:

1. Image-developing apparatus for use in combination with a color-producing substrate; said substrate including a coating composition which contains a chromogenic material and a developer material, said chromogenic material being isolated from said developer material in said chromogenic material and said developer material being co-reactive with said chromogenic material to form a color; said image developing apparatus comprising:
   (a) means for image-wise exposing said color producing substrate;
   (b) means for advancing said exposed substrate to the developing section of said image-developing apparatus;
   (c) a developer roll for releasing said isolated chromogenic material, in the absense of rupturing pressure, by burnishing the surface of said substrate; and
   (d) drive means for actuating said developer roll.

2. The image developing apparatus of claim 1 wherein said developer roll includes a fibrous outer surface and, wherein upon actuation by said drive means, said fibrous outer surface provides the force necessary to release the isolated chromogenic material.

3. The image developing apparatus of claim 2 wherein said fibrous outer surface comprises a plurality of flexible bristles.

4. The image developing apparatus of claim 2 wherein said fibrous outer surface is felt.

5. The image developing apparatus of claim 1 wherein a plurality of developer rolls are used to release said isolated chromogenic material.

6. The image developing apparatus of claim 1 additionally comprising heat means for use in combination with said developer roll to produce a color upon reaction of said chromogenic material with said developer material.

7. Image-developing apparatus for use in combination with a photosensitive substrate; said photosensitive substrate including a coating composition containing an encapsulated chromogenic material, a photosensitive composition and a developer material, said developer material being co-reactive with said chromogenic material to form a color; said image developing apparatus comprising:
   (a) means for image-wise exposing said photosensitive substrate;
   (b) means for advancing said exposed photosensitive substrate to the developer section of said image-developing apparatus;
   (c) a developer roll for releasing said encapsulated chromogenic material, in the absence of rupturing pressure, by burnishing the surface of said photosensitive substrate; and
   (d) drive means for actuating said developer roll.

8. The image developing apparatus of claim 1 wherein said developer roll includes a fibrous outer surface, said fibrous outer surface, upon actuation by said drive means, providing the force necessary to rupture the microcapsules containing said chromogenic material.

9. The image developing apparatus of claim 8 wherein said fibrous outer surface comprises a plurality of flexible bristles.

10. The image developing apparatus of claim 8 wherein said fibrous outer surface is felt.

11. The image developing apparatus of claim 7 wherein a plurality of developer rolls are used to release said encapsulated chromogenic material.

12. The image developing apparatus of claim 7 additionally comprising heat means for use in combination with said developer roll to produce a color upon reaction of said chromogenic material with said developer material.

13. Image-developing apparatus for use in combination with a photosensitive substrate; said photosensitive substrate including a coating composition containing microcapsules, said microcapsules containing a solution of a chromogenic material and a photosensitive composition, and a color developer material, said color developer material being co-reactive with said chromogenic material; said image developing apparatus comprising:
   (a) means for image-wise exposing said photosensitive substrate;
   (b) drive means for advancing said exposed photosensitive substrate to said image developing apparatus;
   (c) a developer roll for releasing said encapsulated material in the absence of rupturing pressure by burnishing the surface of said exposed photosensitive substrate, said developer roll including a fibrous outer surface, said fibrous outer surface, when rotated, providing the force necessary to rupture said microcapsules; and
   (d) drive means for actuating said developer roll.

14. The image developing apparatus of claim 13 wherein said fibrous outer surface comprises a plurality of flexible bristles.

15. The image developing apparatus of claim 13 wherein said fibrous outer surface is felt.

* * * * *